United States Patent
Haider

(10) Patent No.: US 7,396,755 B2
(45) Date of Patent: *Jul. 8, 2008

(54) PROCESS AND INTEGRATION SCHEME FOR A HIGH SIDEWALL COVERAGE ULTRA-THIN METAL SEED LAYER

(75) Inventor: Asad M. Haider, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 390 days.

This patent is subject to a terminal disclaimer.

(21) Appl. No.: 11/126,413

(22) Filed: May 11, 2005

(65) Prior Publication Data

US 2006/0258152 A1 Nov. 16, 2006

(51) Int. Cl.
*H01L 21/4763* (2006.01)

(52) U.S. Cl. ............... 438/618; 438/680; 257/E21.17; 257/E21.585; 257/E21.632

(58) Field of Classification Search ............... 438/618, 438/637, 692, 700, 680, 723, 743, 756, 766, 438/768, 769, 197
See application file for complete search history.

(56) References Cited

U.S. PATENT DOCUMENTS

| | | | |
|---|---|---|---|
| 5,869,395 A * | 2/1999 | Yim | 438/637 |
| 6,340,435 B1 * | 1/2002 | Bjorkman et al. | 216/72 |
| 6,669,858 B2 * | 12/2003 | Bjorkman et al. | 216/72 |
| T39,520 | 5/2005 | Haider et al. | |
| 2004/0061237 A1 * | 4/2004 | Zhao et al. | 257/762 |
| 2006/0258142 A1 * | 11/2006 | Haider et al. | 438/618 |

* cited by examiner

*Primary Examiner*—David Nhu
(74) *Attorney, Agent, or Firm*—Wade J. Brady, III; Frederick J. Telecky, Jr.

(57) ABSTRACT

The present invention provides a method of forming a metal seed layer 100. The method includes physical vapor deposition of seed metal 200 within an opening 140 located in a dielectric layer 135 of a substrate 110. The method also includes a RF plasma etch of the seed metal 200 deposited in the opening 140 simultaneously with conducting the physical vapor deposition of the seed metal 200.

18 Claims, 6 Drawing Sheets

US 7,396,755 B2

PROCESS AND INTEGRATION SCHEME FOR A HIGH SIDEWALL COVERAGE ULTRA-THIN METAL SEED LAYER

TECHNICAL FIELD OF THE INVENTION

The present invention is directed, in general, to a method for manufacturing integrated circuits and more specifically, to a method of manufacturing a metal seed layer for an interconnect of the integrated circuit.

BACKGROUND OF THE INVENTION

The push toward smaller and faster semiconductor devices has resulted in a shift toward the use of copper for making electrical interconnections in integrated circuits. For example, copper offers a number of benefits over aluminum: higher electrical conductivity, good resistance to electro-migration, and reduced cross talk and propagation delays at higher interconnect densities. The fabrication of copper interconnects are not without difficulties, however.

For instance, when copper is etched, it tends to be redeposited elsewhere on the semiconductor device, or in the deposition chamber. Copper atoms also readily diffuse into silicon-containing dielectric layers. The contamination by copper in unwanted locations can degrade or destroy the performance of microelectronic devices in the integrated circuit.

One way to reduce the problems with copper etching and diffusion is to deposit an underlying barrier layer to block the migration of copper atoms into other components of the semiconductor. To facilitate the adhesion of copper to the diffusion barrier, a seed layer of copper is deposited over the diffusion barrier, followed by the deposition of a second thicker copper-conducting layer over the copper seed layer.

The requirement for a diffusion barrier layer when using copper-containing interconnects introduces another problem. Because the barrier layer occupies a portion of the space in the interconnect, the thickness of the copper seed layer deposited over the barrier layer in the interconnect must be reduced. Moreover, as the dimensions of interconnects shrink with each decrease in node size, so too does the thickness of the copper seed layer.

Depositing a thin metal seed layer is problematic, however. For instance, conventional physical vapor deposition (PVD) processing tools tend to deposit the copper seed layer too rapidly making it difficult to control the layer's thickness. Conventional PVD processes also do not provide a uniform and conformal coating of the copper seed layer inside the interconnect. Typically, the sidewalls of the interconnect have a smaller thickness of the copper seed than the bottom of the interconnect. Additionally, conventional PVD processes can produce an overhang of copper around the top edge of the interconnect. An overhang can exacerbate the inadequate deposition of copper seed on the sidewalls and in some cases pinch off the opening of the interconnect, resulting in a void formation in the interconnect.

Conventional PVD processes also tend to deposit more copper seed on central portions of a wafer substrate than at the edge of the wafer. Consequently the effects of poor sidewall coverage and overhangs will vary for integrated circuits fabricated on different locations of a wafer. This, in turn, can cause undesirable variations in the performance of the integrated circuits built on different areas of the wafer.

Accordingly, what is needed in the art is a method and system for manufacturing interconnects having uniformly conformal, thin, and continuous interconnect metal seed layers, while avoiding the above-discussed disadvantages associated with conventional methods and systems for forming such layers.

SUMMARY OF THE INVENTION

To address the above-discussed deficiencies of the prior art, the present invention provides in one embodiment, a method of forming a metal seed layer. The method comprises physical vapor deposition of a metal within an opening located in a dielectric layer of a substrate. The method also comprises a radiofrequency (RF) plasma etch of the metal deposited in the opening simultaneously with conducting the physical vapor deposition of the metal.

Another aspect of the present invention is a method of manufacturing an integrated circuit. The method comprises forming a microelectronic device on a substrate and forming a dielectric layer over the microelectronic device. The method further comprises forming an interconnect metal seed layer in an opening in the dielectric layer comprising of above-described physical vapor deposition RF plasma etch.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying figures. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
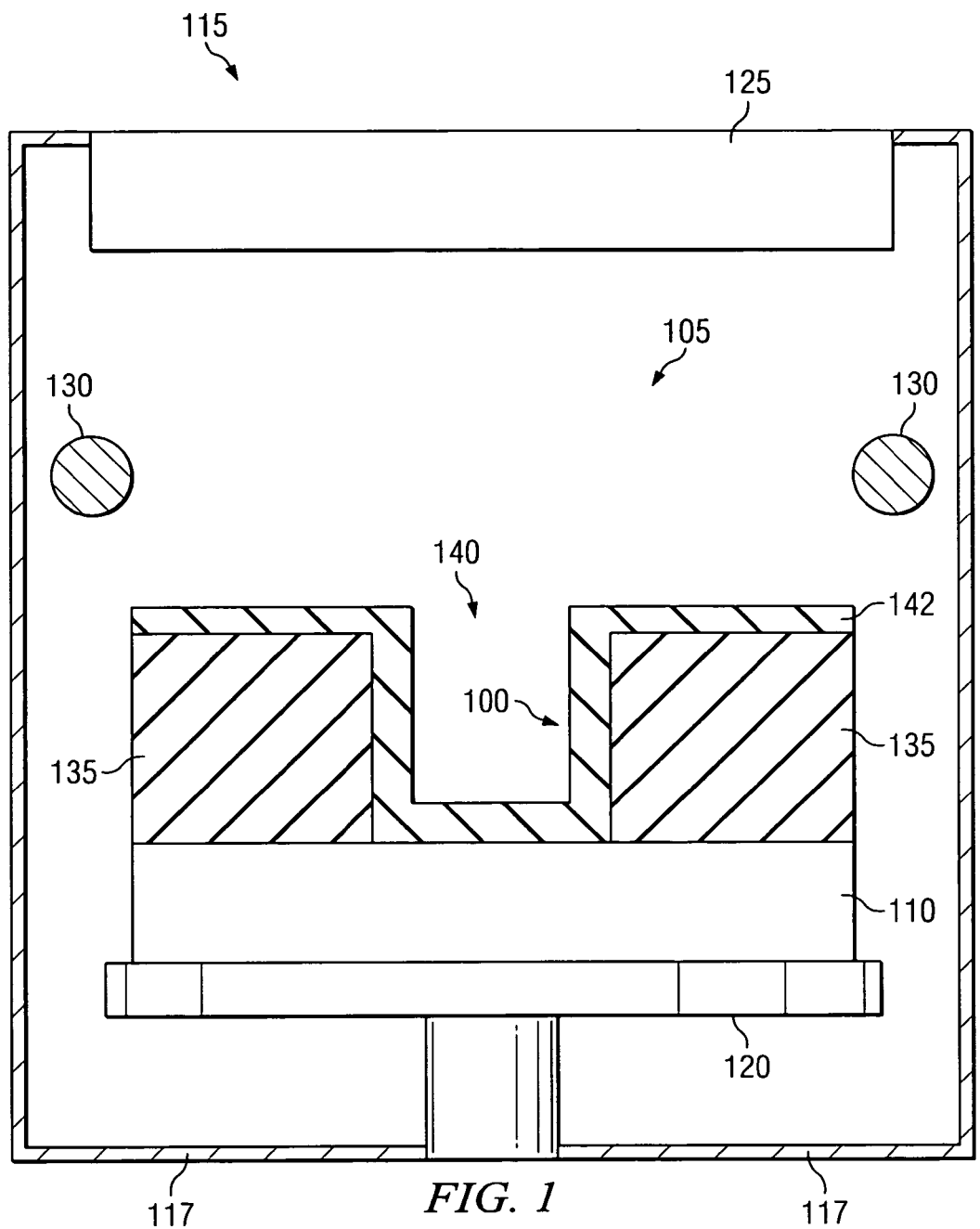
FIGS. 1 to 3 illustrate cross-sectional views of selected steps in an exemplary method of forming a metal seed layer according to the principles of the present invention.

As part of the present invention it was determined that conventional physical vapor deposition methods for forming a metal seed layer are problematic because they deposit the seed metal in a directional manner. The directional deposition causes the excessive thickness of the metal seed layer at the bottom as compared to the sidewalls of the interconnect. Moreover, the directional deposition of seed metal causes non-uniform metal seed layer thicknesses on the sidewalls. The directional deposition can also cause the seed metal to accumulate at the top of the interconnect creating an overhang. The overhanging seed metal further restricts the formation of a metal seed layer to a greater degree on sidewalls than on the bottom of the interconnect. The overhanging seed metal also can prevent complete filling of the interconnect with a metal. These problems are exacerbated for interconnects located at the perimeter of wafers because the extent of directional deposition of seed metal is greater at the perimeter than at the center of the wafer.

It was also determined that conventional attempts to remedy the non-uniformity of metal seed layers by re-sputtering the seed metal are inadequate. The term re-sputter refers to the application of a separate radiofrequency (RF) plasma etch step after a physical vapor deposition step. Re-sputtering decreases the non-uniformity of the metal seed layer by redistributing seed metal from the bottom to the sidewalls of the interconnect. Unfortunately, for interconnects with smaller widths, and hence thinner metal seed layer thicknesses, re-sputtering cannot be adequately controlled to form a uniform seed metal layer. For instance, re-sputtering often entirely removes seed metal from the bottom of the interconnect. As a result, an additional seed metal layer deposition step is required to deposit new seed metal at the bottom of the interconnect. The additional seed metal layer deposition steps can exacerbate the extent of overhanging material at the top of the interconnect, however. Moreover, the total throughput of wafers that can be fabricated in a deposition tool is decreased because of the extra time required for re-sputtering step and the additional deposition step.

The present invention recognizes, for the first time, the advantages of combining physical vapor deposition and radiofrequency plasma etching into a single step, where both of these operations are performed simultaneously. While not limiting the scope of the invention by theory, it is believed that physical barrier deposition in the presence of a magnetic field generated in the vicinity of the interconnect as part of the radiofrequency plasma etch helps disperse the atoms being deposited. This in turn makes the metal seed layer deposition process substantially omni-directional. Consequently, the uniformity of the metal seed later in the interconnect is greatly improved. The total throughput of wafers in the deposition tool is also improved because the time spent on separate deposition, re-sputtering and repeat deposition steps can be greatly reduced or eliminated entirely.

Figure 2:
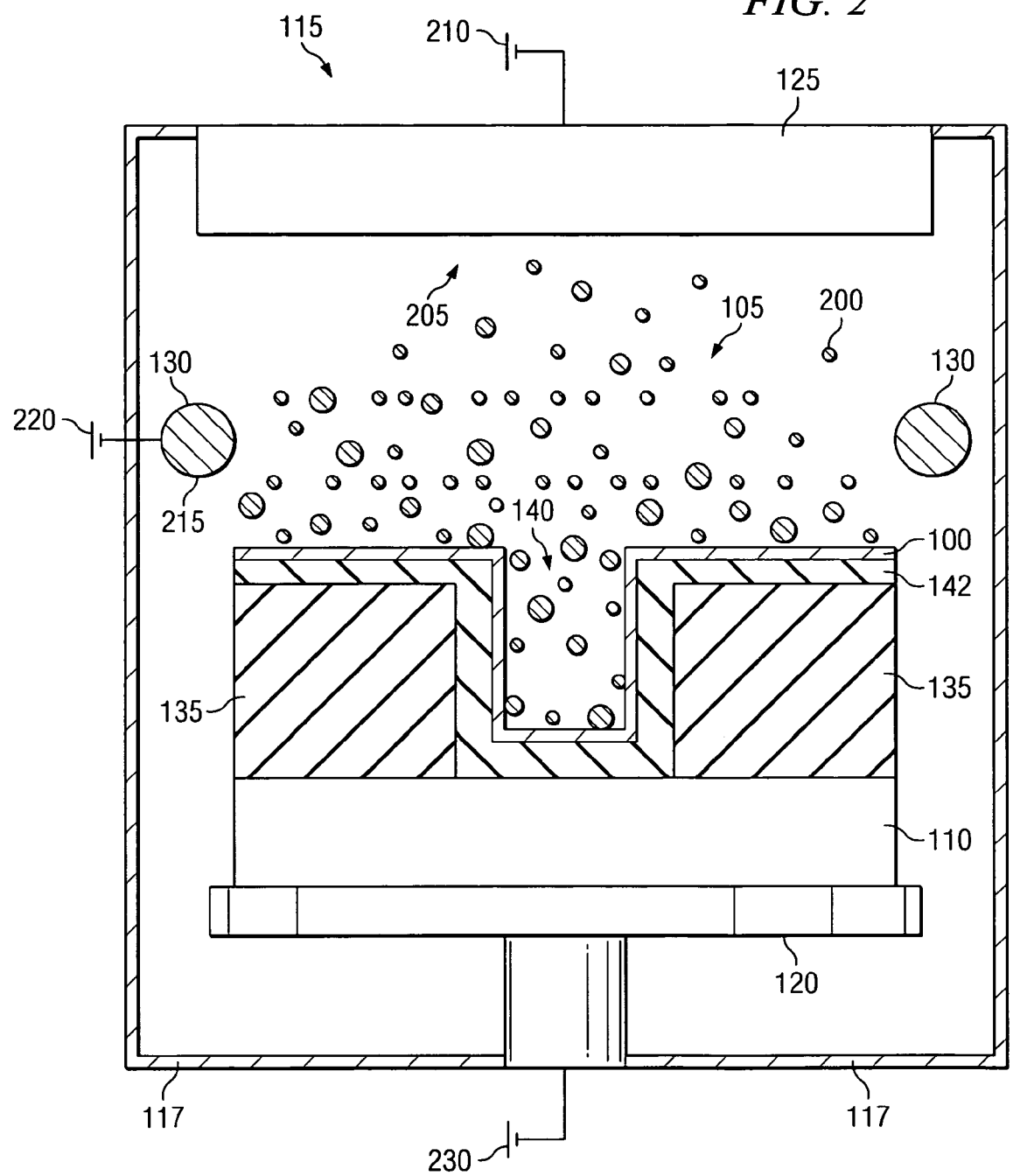
Figure 3:
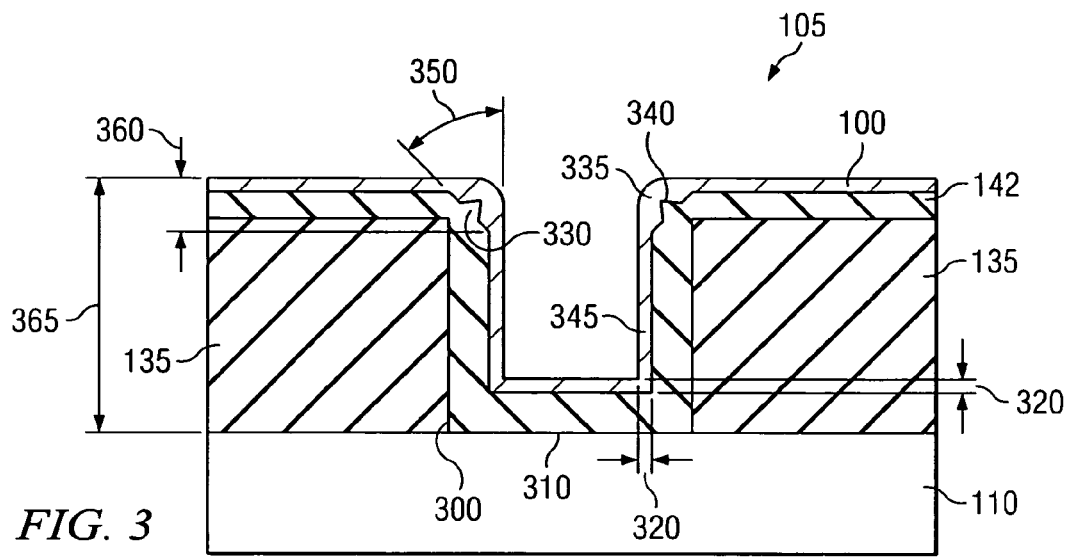

One embodiment of the present invention is a method of forming a metal seed layer. FIG. 1 to 3 illustrate cross-sectional views of selected steps of an exemplary method of forming a metal seed layer 100. Turning first to FIG. 1, illustrated is a partially completed interconnect 105 after placing a substrate 110 in a deposition tool 115, such as a physical vapor deposition tool. The deposition tool 115 comprises conventional components to facilitate barrier layer 100 deposition. For instance, the embodiment of the deposition tool 115 illustrated in FIG. 1 depicts a chamber 117 that comprises a pedestal or chuck 120 configured to hold the substrate 110, a target 125 and a RF coil 130.

The substrate 110 can comprise any conventional material used in microelectronic device fabrication. In certain preferred embodiments, the substrate 110 is a silicon wafer. The substrate 110 can include other conventional materials, such as oxide and metal layers, used in the manufacture of active or passive devices.

The substrate 110 depicted in FIG. 1 has a dielectric layer 135 with an opening 140 formed therein for the construction of the interconnect 105. In some embodiments the dielectric layer 135 is an interlayer or intra-metal dielectric layer in an integrated circuit. In some preferred embodiments the dielectric layer 135 comprises silicon carbide, organo-silicate glass (OSG), tetraethyl orthosilicate (TEOS) or combinations thereof, including multi-layered combinations thereof. The opening 140 can be formed using any conventional process for forming vias, trenches or lines in microelectronic devices, including single or dual damascene integration schemes.

The substrate 110 depicted in FIG. 1 also has a barrier layer 142 that conformally covers the dielectric layer 135 and opening 140. Preferably the barrier layer 142 is formed before forming the metal seed layer. Any conventional method such as physical vapor deposition can be used to form the barrier layer 142. The barrier layer 142 can comprise any conventional material used to provide a barrier against the diffusion of an interconnect metal into the substrate 110. For instance, in cases where the opening 140 is to be filled with copper, the barrier layer 142 preferably comprise tantalum, tantalum nitride or a combination thereof. In other embodiments the barrier layer 142 comprise any conventional metals used to form a diffusion barrier, including titanium, titanium nitride, tantalum, zirconium, ruthenium, iridium, iridium oxide, platinum, or combinations thereof.

With continuing reference to FIG. 1, FIG. 2 illustrates the partially completed metal seed layer 100 by physical vapor depositing seed metal 200 over the substrate 110 and within the opening 140 while simultaneously RF plasma etching the seed metal 200 deposited in the opening 140. In some preferred embodiments the seed metal 200 comprises copper or more preferably is pure copper. In other embodiments the seed metal 200 comprises a copper alloy, preferably comprising copper and one or more of Sn, Pd, C, Ca, Mg, Al, and Hf, to improve resistance of the seed metal 200 to attack by electrochemical plating chemistry.

Physical vapor deposition of the seed metal 200 preferably comprises sputtering, although other methods of physical vapor deposition such as evaporation are also within the scope of the present invention. In some instances, physical vapor deposition comprises impacting the target 125 comprised of seed metal 200 with ions 205, such as positively charged argon ions. In some cases, physical vapor deposition further comprises applying a direct current 210 to the target 125 to negatively bias the target 125 and thereby attract the ions 205 to the target 125. In some preferred embodiments, the direct current 210 applied to the target 125 has a power ranging from about 20 to about 50 kilowatts.

The radiofrequency plasma etch is produced by applying an alternating current (AC) 220 to the RF coil 130. In some preferred embodiments, the AC 220 is applied to the RF coil 130 at a power ranging from about 300 to about 1400 Watts. In some preferred embodiments, the AC 220 is applied at a frequency of about 14 Megahertz.

It is advantageous for both the direct current 210 and the AC 220 to be applied at a constant power within their respective ranges during the simultaneous deposition and etch step. Holding these power settings at a constant value improves the uniformity of barrier layer 100 formation both within different areas of the same substrate 110 as well as between different substrates 110. For instance, it is preferable for the power settings associated with the direct current 210 and the AC 220 to vary by less than about ±1 percent throughout the entire simultaneous physical vapor deposition and RF plasma etch step.

As illustrated in FIGS. 1 and 2, the coil 130 used for RF plasma etching can be located inside the chamber 117 of the deposition tool 115. In other embodiments of the tool 115, however, a RF coil is located outside of the chamber 117. In cases where the RF coil 130 is inside of the chamber 117, it is preferable that the surface 215 of the RF coil 130 be composed substantially of the seed metal 200. A surface 215 made of seed metal 200 is preferred because this eliminates the potential for undesired non-seed metal material from being deposited from the RF coil 130 into the opening 140, and thereby changing the composition and properties of the metal seed layer 100.

In yet other embodiments of the method, an AC positive voltage bias 230 is applied to the substrate 110. As well known to those skilled in the art, the rate and directionality of seed metal 200 physical vapor deposition can be modulated to increased or decreased levels by applying a positive bias to the substrate 110. The rate of RF plasma etching is also affected by the AC positive voltage bias 230. The AC positive voltage bias 230 is preferably applied during, and more preferably throughout, the simultaneous physical vapor deposition and RF plasma etch step.

In preferred embodiments, as illustrated in FIG. 2, the AC positive voltage bias 230 is indirectly applied to the substrate 110, for example, through the pedestal or chuck 120 that the substrate 110 is located on. Applying the AC positive voltage bias 230 directly to the substrate 110 is also within the scope of the present invention. In some preferred embodiments, where an AC positive voltage bias 230 is applied to the substrate 110, the applied power is up to about 900 Watts. More preferably, the AC positive voltage bias 230 is applied at a constant power (e.g., ±1 percent) for the desired setting within this range throughout the entire simultaneous deposition and etching process.

The conditions for depositing and etching during the simultaneous process must be carefully adjusted and controlled so that these two processes cooperate to form the desired uniform metal seed layer 100. For instance, in some cases it is advantageous for the deposition tool 115 to be configured to provide rates of seed metal 200 deposition and etching that can range from about 20 to about 75 Angstroms per second. Configuring the deposition tool 115 in this manner is facilitated by calibrating the tool 115 for its separate rates of deposition and etching over a range of process parameters and for the seed metal 200 of interest on a blank (i.e., unpatterned) wafer. One of ordinary skill in the art would be familiar with the type and range of process parameters that are important for different seed metals and how these would depend on the particular type of deposition tool 115 being used. Non-limiting examples of such process parameters include the above-mentioned direct current 210 to the target 125, AC 220 power to the RF coil 130 and AC positive voltage bias 230 to the substrate 110, as well as other tool settings such as the pressure of the chamber 117 or the energy of the ions 205.

During the simultaneous deposition and etch process, the process parameters of the deposition tool 115 are adjusted to provide the desired rates of deposition and etching based on the above-mentioned tool calibrations. For instance, the expected rates of deposition and etching are adjusted so that there is a net deposition of seed metal 200 in the opening 140. This is achieved by providing a rate of deposition that is greater than the rate of etching during the simultaneous deposition and etching process. In some preferred embodiments, the simultaneous physical vapor depositing and RF plasma etching corresponds to a ratio of rates of physical vapor depositing to RF plasma etching that ranges from greater than about 1:1 to about 15:1, and even more preferably about 5:1.

These principles are illustrated in the following example. For the purposes of illustration, the deposition tool's 115 calibrated rate of copper physical vapor deposition on a blank wafer is about 150 Angstroms per second when applying 40 kilowatts of direct current 210 to the target 125 and about 100 Watts of AC positive voltage bias 230 to the blank wafer. The above assumes that the deposition tool's 115 calibrated rate of RF plasma etching of a copper layer on a blank wafer equals about 30 Angstroms per second when the AC 220 is applied at a power of 900 Watts to the RF coil 130. If the simultaneous deposition and etching process were performed under the above-described conditions, the ratio of rates of physical vapor depositing to RF plasma etching would be about 5:1.

One advantage realized with the simultaneous physical vapor deposition and RF plasma etch process is that the rate of deposition of barrier material 200 is more finely controlled than possible by physical vapor deposition alone. This is especially important when depositing a thin metal seed layer 100, e.g., a metal seed layer 100 thickness of less than about 40 nm and more preferably less than about 30 nm. For instance, certain commercial physical vapor deposition tools are not designed to deposit or re-sputter such thin metal seed layers. Therefore, even with physical vapor deposition or re-sputter times as short as a few seconds, too much seed metal 200 gets deposited or removed, respectively, making it problematic to consistently produce thin uniform metal seed layers 100 throughout the interconnect 105 and across the substrate 110. In contrast, the simultaneous deposition and etching process of the present invention slows the net deposition of seed layer. This, in turn, allows better control of the rate of metal seed layer 100 formation. Moreover, the rate of metal seed layer 100 formation can be finely controlled by adjusting the ratio of the rates of physical vapor deposition to RF plasma etching.

With continuing reference to FIGS. 1 and 2, FIG. 3 illustrates the metal seed layer 100 after completing the simultaneous physical vapor deposition and RF plasma etch step and removing the substrate 110 from the deposition tool 115. FIG. 3 illustrates another advantage associated with the method: the formation of a conformal metal seed layer 100 with a high degree of uniformity. As an example, the metal seed layer 100 on the sidewalls 300 and bottom 310 of the interconnect 105 can have a thickness variation of less than about ±20 percent relative to a thickness 320 of the metal seed layer 100. Moreover, such small thickness variations are achieved for metal seed layer thickness 320 of about 50 nm or less.

FIG. 3 illustrates still another advantage associated with the simultaneous physical vapor deposition and RF plasma etch process: the formation of the interconnect 105 with a beveled opening 330. A beveled opening 330 is advantageous in instances where the production of a seed metal overhang 335 during interconnect 105 formation remains problematic. The simultaneous deposition and etch step of the present invention substantially reduces the size of the seed metal overhang 335, or in some cases eliminates the overhang completely. Additionally, the beveled opening 330 reduces the deleterious effects of a barrier material overhang 340 formed during the conventional physical vapor deposition of the barrier layer 142. For example forming the beveled opening 330 helps prevent the interconnect 105 from being restricted or entirely closed by reducing the size of the barrier material overhang 340. Conventional methods typically require a separate step, such as argon sputtering, or re-sputtering to form a beveled opening. The present invention eliminates the need to perform these additional steps because the beveled opening 330 is formed during the simultaneous deposition and etch step to form the metal seed layer 100.

The top angle 350 of the beveled opening 330 is controlled by adjusting the ratio of the rate of physical vapor deposition to the rate of RF plasma etching during the simultaneous deposition and etch step. The higher the ratio, the smaller the top angle 350 of the beveled opening 330. Too large a top angle 350 is undesirable because this increases the risk that the interconnect 105 could interfere with other features on the substrate 110. Too small a top angle 350, however, does not mitigate the above-discussed detrimental effects of overhang 340 formation. A ratio of the rates of physical vapor deposition and RF plasma etching in the range from greater than 1:1 to 15:1 produces a top angle 350 ranging from about 10 to about 70 degrees, respectively. Preferably, the height 360 of the beveled opening 330 comprises less than about an upper 10 percent of the height 365 of the interconnect 105.

Figure 4:
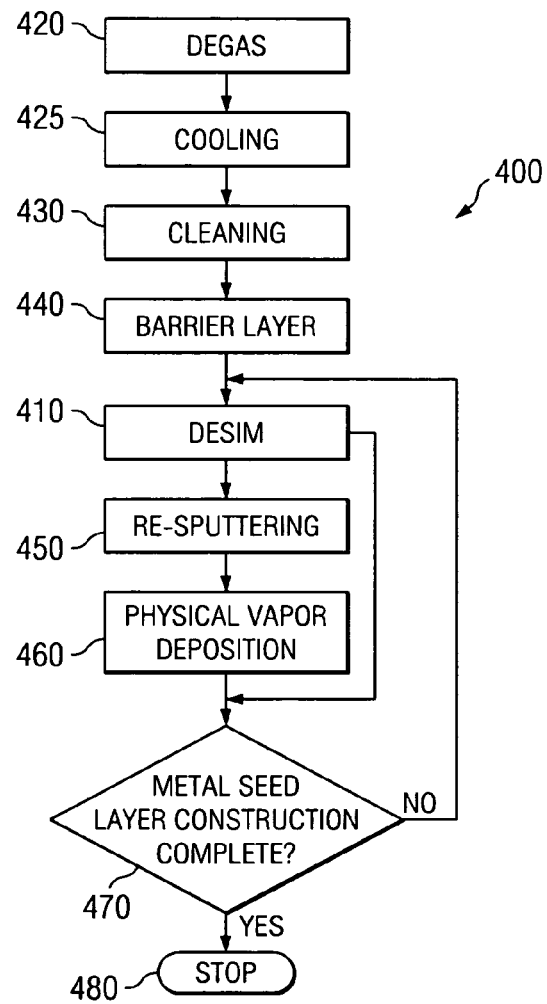
FIG. 4 presents by flow diagram, an exemplary method of forming a metal seed layer following the principles of the present invention.

The above-described method of forming metal seed layer can be integrated with a number of additional steps to facilitate metal seed layer formation. This is illustrated in FIG. 4, which presents by flow diagram, an exemplary method 400 of forming a metal seed layer. As shown in FIG. 4, the method 400 comprises a step 410 of simultaneous physical vapor deposition of seed metal material and a RF plasma etch (DESIM). The DESIM step 410 can include any of the embodiments discussed above in the context of FIGS. 1-3.

Some preferred embodiments of the method 400 also comprise a degassing step 420. In some embodiments degassing 420 comprises heating a substrate wafer from about 200 to about 350° C. for about 1 to 3 minutes. Degassing 420 advantageously removes any volatile components such as organic material or water, off of the substrate surface. In some instances, it is advantageous for the degassing step 420 to be followed by a cooling step 425. In some cases cooling comprises reducing the substrate's temperature to about 30° C. or lower.

Other advantageous embodiments of the method 400 further comprise a cleaning step 430. The cleaning step 430 advantageously removes any foreign material not removed by degassing. In some preferred embodiments cleaning 430 comprises a plasma sputter etch using argon as the sputtering source. In other cases cleaning 430 comprises a reactive plasma etch using a mixture of hydrogen and helium.

Certain embodiments of the method 400 include a step 440 of forming a barrier layer. In some cases it is advantageous for the barrier layer to be formed by atomic layer deposition (ALD) followed by physical vapor deposition, both of these being performed before the DESIM step 410. ALD can advantageously form a very thin conformal barrier layer (e.g., about 2.5 nm thick) in the interconnect opening. Moreover atomic layer deposition is especially good at forming thin barrier layers comprising metal nitride. Any conventional materials and instrumentation can be used to facilitate atomic layer deposition of the barrier material. In some preferred embodiments, where the atomic layer deposited barrier layer comprises tantalum nitride, the organo-metallic precursor comprises pentakis(dimethylamide)tantalum. It is still desirable to perform the physical vapor deposition of the barrier layer following ALD to improve adhesion between the metal seed and barrier layer, and the reliability of the barrier layer. Of course, in other embodiments the barrier layer can be formed by physical vapor deposition alone.

Other embodiments of the method 400 include a re-sputtering step 450, in which a separate RF plasma etch is performed. Any of the conditions used for the RF plasma etch component of the DESIM step 410 can also be used for the separate RF plasma etch. In some cases the separate RF etch of re-sputtering 450 comprises applying a second AC at a second power to the same RF coil as used for the DESIM step 410, in an absence of physical vapor deposition of barrier material. As noted above, re-sputtering 450 advantageously removes excessive amounts of seed metal from the bottom of the interconnect and redistributes the seed metal to the side walls. In some preferred embodiments the re-sputtering step 450 is performed immediately after the DESIM step 410.

Still other embodiments of the method include a separate step 460 of physical vapor deposition (PVD) of seed metal. Any of the conditions used for the physical vapor deposition component of the DESIM step 410 can also be used for the separate physical vapor deposition. A separate PVD step 460 is especially beneficial where one or both of the DESIM step 410 or re-sputtering step 450 have produced a metal seed layer with insufficient thickness at the bottom of the interconnect. In some preferred embodiments, the PVD step 460 is performed after the re-sputtering step 450 to deposit seed metal onto the bottom of the interconnect. In other cases it is advantageous to perform the PVD step 460 after the DESIM step 410. This is advantageous when the DESIM step 410 has produced a metal seed layer with a lower than desired thickness of seed metal at the bottom of the interconnect.

At step 470 it is decided whether or not metal seed layer formation is completed. For instance, the decision can be based on whether or not certain performance criterion such as metal seed layer thickness and uniformity or the beveled opening dimensions were met for test interconnects manufactured using the same sequence of fabrication steps. In cases where further processing is desired, in some embodiments of the method, one or both of the re-sputtering and physical vapor deposition steps 450, 460 are performed alternately with the DESIM step 410 in an iterative fashion for a plurality of times before stopping the process at step 480. One skilled in the art would understand how to balance the inclusion and repetition of the optional steps 420 to 470 to produce a more uniform metal seed layer verses reducing the deposition tool's throughput due to the extra time required to perform these additional steps.

Figure 5:
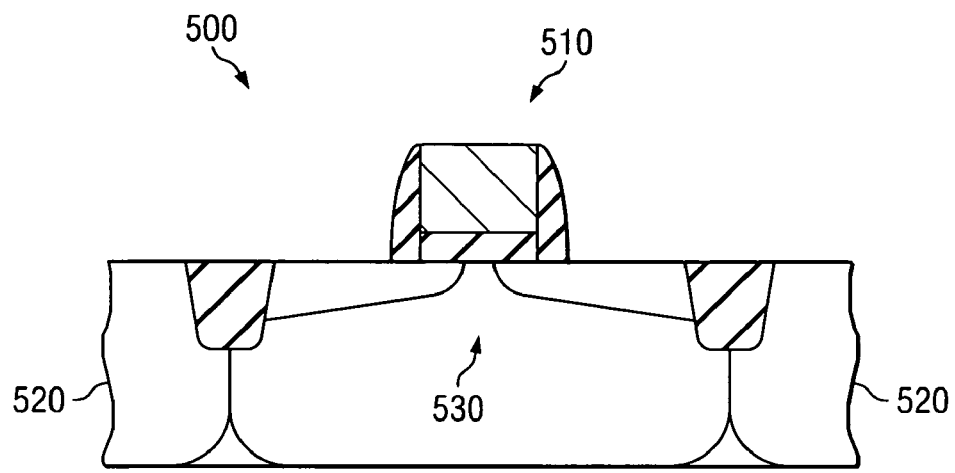
FIGS. 5 to 10 present cross-sectional views of an exemplary method of manufacturing an integrated circuit according to the principles of the present invention.

Another aspect of the present invention is a method of manufacturing an integrated circuit. FIGS. 5-10 illustrate cross-sectional views of selected steps in an exemplary method of manufacturing an integrated circuit 500 according to the principles of the present invention. Turning first to FIG. 5, illustrated is the partially completed integrated circuit 500 after forming a microelectronic device 510 on a substrate 520. The microelectronic device 510 can comprise an nMOS transistor 530. Embodiments of the microelectronic device 510 can further comprise additional nMOS and pMOS transistors, CMOS, BiCMOS devices, bipolar, or other conventional active or passive integrated circuit components, and combinations thereof.

Figure 6:
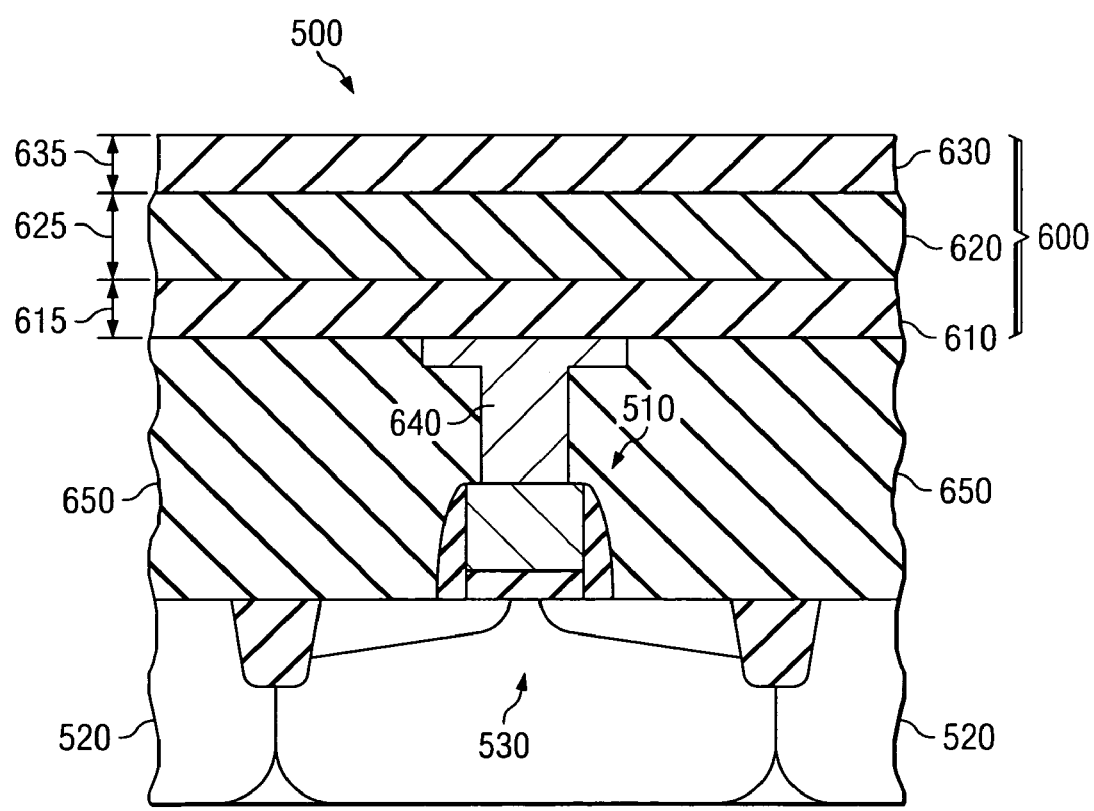

FIG. 6 illustrates the partially completed integrated circuit 500 after forming a dielectric layer 600 over the microelectronic device 510. The dielectric layer 600 can comprise any conventional material, such as silicon dioxide. The dielectric layer 600 is formed using conventional techniques, such as Plasma Enhanced Chemical Vapor Deposition of silicon dioxide to a desired thickness under conditions well known to those of ordinary skill in the art. For the particular embodiment shown in FIG. 6, the dielectric layer 600 comprises a silicon carbonitride layer 610 having a thickness 615 of about 60 nm, an OSG layer 620 having a thickness 625 of about 260 nm, and TEOS cap layer 630 having a thickness 635 of about 180 nm. For the embodiment illustrated in FIG. 6, the dielectric layer 600 is an interlayer dielectric layer formed over a conventionally formed metal line 640 in a second dielectric layer 650 formed over the microelectronic device 510.

Figure 7:
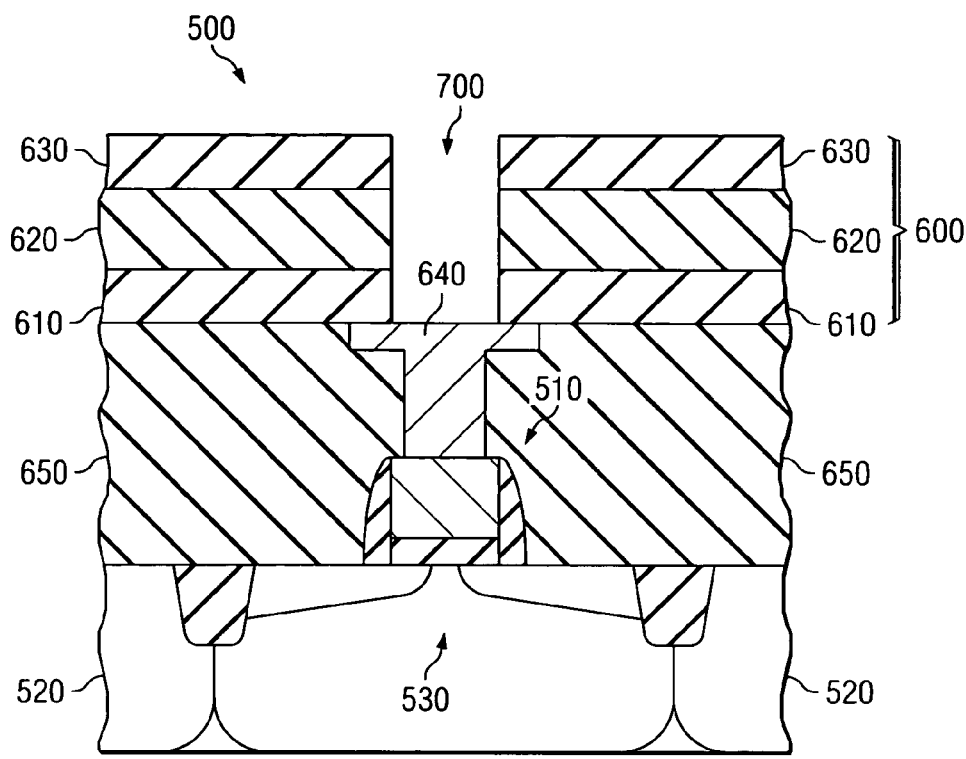

Turning now to FIG. 7, illustrated is the partially completed integrated circuit 500 after forming an opening 700 in the dielectric layer 600. Those of ordinary skill in the art would be familiar with the variety of conventional photolithography and etching processes that can be used to form the opening 700. For the embodiment presented in FIG. 7 the opening 700 is formed over the metal line 640.

Figure 8:
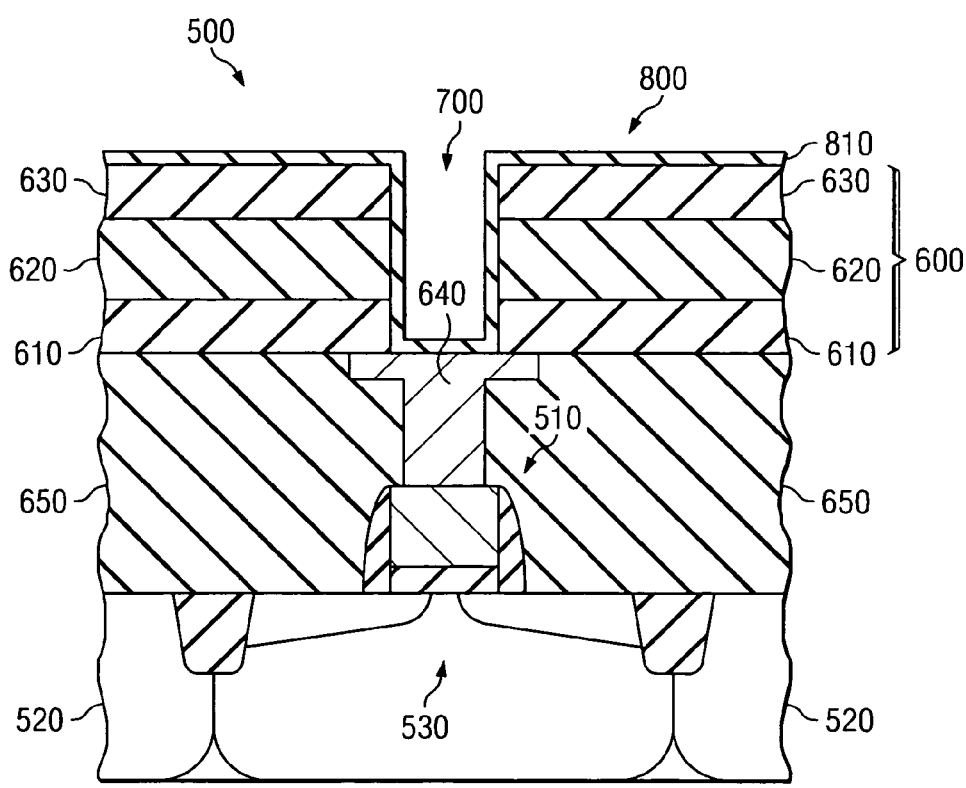
Figure 9:
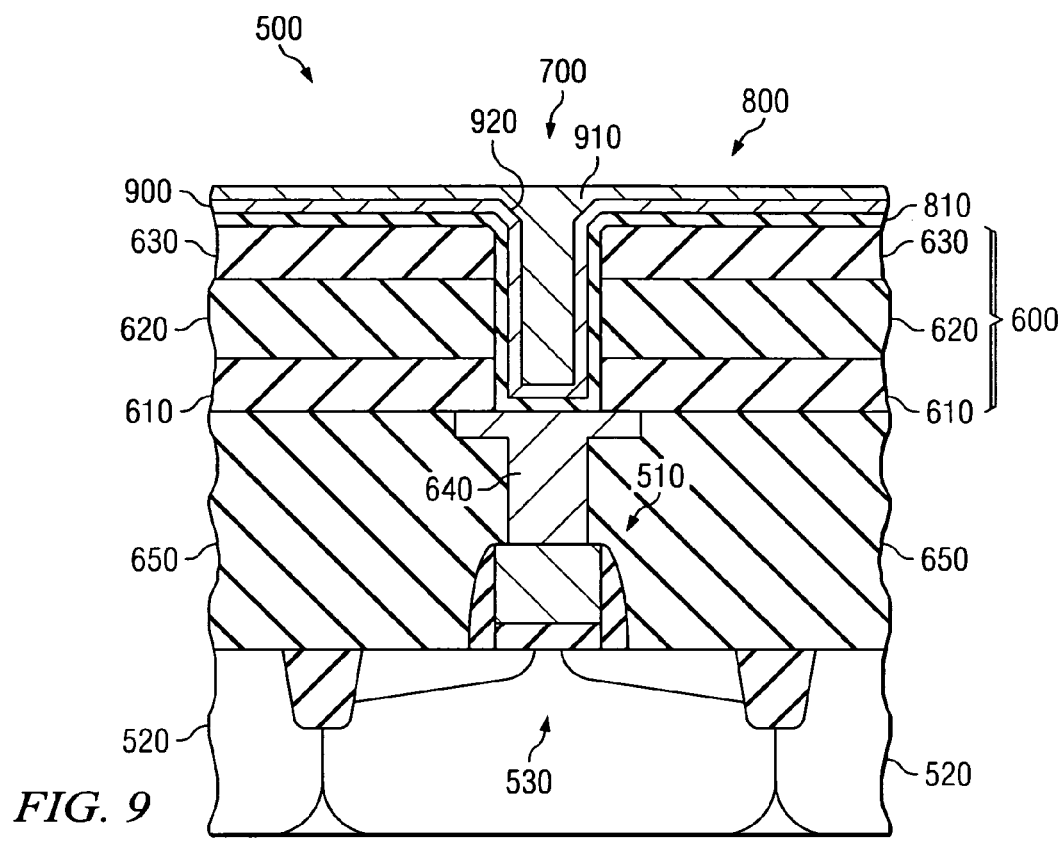

FIGS. 8-9 illustrate selected stages in forming an interconnect 800 in the opening 700 in the dielectric layer 600. Turning to FIG. 8, illustrated is the partially completed integrated circuit 500 after forming a barrier layer 810 in the interconnect 800. The barrier layer 810 can be formed by any conventional process, such as ALD or PVD processes discussed in the context of FIGS. 1-4 above.

FIG. 9 illustrates the partially completed integrated circuit 500 after forming a metal seed layer 900 over the substrate 110, and in preferred embodiments on the barrier layer 810 and filling the interconnect 800 with a metal layer 910. In some preferred embodiments both the metal seed layer 900 and metal layer 910 comprise copper. The metal layer 910 is preferably deposited by a wet process, such as electrochemical deposition or electroless chemical deposition.

Metal seed layer 900 formation can comprise any embodiments of the above-described simultaneous method of physical vapor deposition of seed metal within the opening 700 and RF plasma etching of the seed metal deposited in the opening 700. Of course, any of the above-described additional steps for forming the metal seed layer 900, such as discussed in the context of FIG. 4, can also be integrated into the method of manufacturing the integrated circuit 500. As further illustrated in FIG. 9 in some cases, the interconnect 800 comprises a beveled opening 920.

Figure 10:
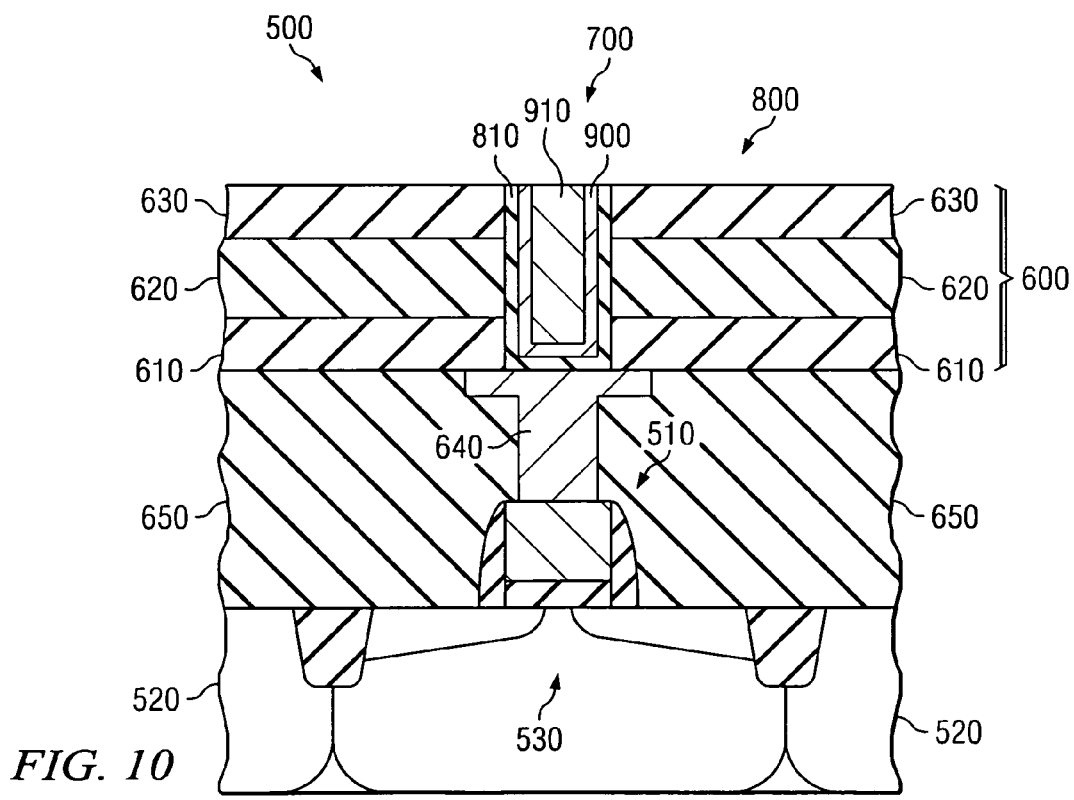

FIG. 10 shows the partially completed integrated circuit 500 after planarizing the substrate 520 to remove portions of the barrier layer 800, metal seed layer 900 and excess metal layer 910 lying outside the opening 700. Planarizing can be achieved by any conventional process such as chemical mechanical polishing. In some cases such as illustrated in FIG. 10, planarizing removes the beveled opening 920 shown in FIG. 9. In other cases portions of the beveled opening remain in the interconnect 800.

One of ordinary skill would understand that the method of manufacturing the integrated circuit 500 depicted in FIGS. 5-10 can be extended to form additional interconnects over the microelectronic device 510 and would understand how to connect those interconnects with the microelectronic device 510 to form an operative integrated circuit 500.

Although the present invention has been described in detail, those skilled in the art should understand that they can make various changes, substitutions and alterations herein without departing from the scope of the invention in its broadest form.

What is claimed is:

1. A method of forming a metal seed layer, comprising:
   physical vapor deposition of a metal within an opening located in a dielectric layer of a substrate; and
   a radiofrequency (RF) plasma etch of said metal deposited in said opening simultaneously with conducting said physical vapor deposition of said metal wherein said simultaneous physical vapor deposition and RF plasma etch corresponds to a ratio of rates of physical vapor depositing to RF plasma etching ranging from greater than about 1:1 to about 15:1.

2. The method as recited in claim 1, wherein said metal comprises copper.

3. The method as recited in claim 1, wherein said metal comprises a copper alloy.

4. The method as recited in claim 1, wherein said RF plasma etch comprises applying an alternating current (AC) to a RF coil.

5. The method as recited in claim 4, wherein said AC is applied to said coil at a power ranging from about 300 to about 1400 Watts.

6. The method as recited in claim 4, wherein a surface of said coil comprises said metal.

7. The method as recited in claim 1, wherein said physical vapor deposition comprise applying a direct current to a target at a power ranging from about 20 to about 50 kilowatts.

8. The method as recited in claim 1, wherein said simultaneous physical vapor deposition and RF plasma etch comprises applying an AC positive voltage bias to said substrate at a power up to about 900 Watts.

9. The method as recited in claim 1, wherein said simultaneous physical vapor deposition and RF plasma etch reduces an overhang of a barrier layer on said opening.

10. The method as recited in claim 1, wherein said simultaneous physical vapor deposition and RF plasma etch forms an interconnect with a beveled opening having a top angle of about 10 to about 70 degrees.

11. The method as recited in claim 10, wherein a height of said beveled opening comprises less than an upper about 10 percent of a height of said dielectric layer.

12. The method as recited in claim 1, wherein said simultaneous physical vapor deposition and RF plasma etch forms an interconnect having a conformal metal seed layer with a thickness variation of less than about ±20 percent relative to a thickness of said conformal metal seed layer.

13. A method of manufacturing an integrated circuit comprising:
   forming a microelectronic device on a substrate;
   forming a dielectric layer over said microelectronic device;
   forming an interconnect metal seed layer in an opening in said dielectric layer comprising:
      physical vapor deposition of a metal within said opening; and
      a radiofrequency (RF) plasma etch of said metal deposited in said opening simultaneously with conducting said physical vapor deposition of said metal wherein said simultaneous physical vapor deposition and RF plasma etch corresponds to a ratio of rates of physical vapor deposition to RF plasma etching ranging from greater than about 1:1 to about 15:1.

14. The method as recited in claim 13, further comprises a separate re-sputtering and a separate physical vapor deposition step.

15. The method as recited in claim 14, wherein said separate re-sputtering step comprises applying a second alternating current to a RF coil in an absence of a said separate physical vapor deposition of said metal.

16. The method as recited in claim 14, wherein said separate re-sputtering step and said separate physical vapor deposition step are performed iteratively with said simultaneous physical vapor deposition and RF plasma etch.

17. The method as recited in claim 13, further comprises forming a barrier layer in said opening before forming said interconnect metal seed layer.

18. The method as recited in claim 13, further comprises electrochemical depositing a second metal layer on said interconnect metal seed layer.

* * * * *